United States Patent [19]

Suffel

[11] Patent Number: 5,207,548
[45] Date of Patent: May 4, 1993

[54] WAFER TRANSFER APPARATUS

[75] Inventor: Siegfried Suffel, Sindelfingen, Fed. Rep. of Germany

[73] Assignee: International Business Machines Corporation, Armonk, N.Y.

[21] Appl. No.: 790,854

[22] Filed: Nov. 12, 1991

[30] Foreign Application Priority Data

Jan. 19, 1991 [EP] European Pat. Off. ............ 91100635

[51] Int. Cl.$^5$ .............................................. B65G 65/00
[52] U.S. Cl. ................................... 414/404; 414/417; 414/DIG. 4
[58] Field of Search .......... 414/403, 404, 417, DIG. 4

[56] References Cited

U.S. PATENT DOCUMENTS

| | | | |
|---|---|---|---|
| 4,568,234 | 2/1986 | Lee et al. | 414/404 |
| 4,611,966 | 9/1986 | Johnson | 414/404 |
| 4,695,217 | 9/1987 | Lau | 414/404 |
| 4,892,451 | 1/1990 | Mahler | 414/404 X |
| 4,952,115 | 8/1990 | Ohkase | 414/404 X |
| 4,987,407 | 1/1991 | Lee | 414/404 X |

*Primary Examiner*—David A. Bucci
*Attorney, Agent, or Firm*—Francis J. Thornton

[57] ABSTRACT

An apparatus (2) for transferring wafers between carriers of different densities having a loading station and unloading station; a lift for raising the wafers to be transferred into a wafer handler secured to a support. The wafer handler has two substantially cylindrical arms, cantilevered from the support with each arm provided with slotted rollers for holding and guiding wafers inserted therein. The arms are rotatable in four steps of 90 degrees each to cause the rollers to each take four different positions. A first position is for placing a first set of wafers in selected slots in the rollers, a second for holding the first set of wafers and passing a second set of wafers into a different set of slots interdigitated with the first set of wafers, a third position for holding the first and the second sets of wafers, and a fourth for transferring both sets of wafers into a new carrier. The apparatus can vary the sequence of loading and unloading and is suitable for use in automatic wafer production lines.

5 Claims, 1 Drawing Sheet

WAFER TRANSFER APPARATUS

BACKGROUND OF THE INVENTION

1) Technical Field

This invention relates to a semiconductor wafer transfer apparatus and, more particularly, to a transfer apparatus for moving semiconductor wafers vertically and horizontally to transfer the wafers from one location to another.

2) Background Art

In the processing of semiconductor wafers to make semiconductor devices, the wafers are subjected to a myriad of processing steps. It is practical to perform many of these steps on a set of wafers positioned in a carrier having a plurality of spaced slots for receiving the wafers in edgewise, coaxial relation with the wafers spaced from each other. Many of these steps may be performed in a carrier made of plastic, which is relatively inexpensive and easy to work with. However, other steps must be performed at high temperatures, such as in a heat treating furnace, at temperatures that cannot be tolerated by the plastic carrier. Consequently, it is common practice to transfer the wafers from a plastic cassette to a carrier made of quartz, often referred to as a boat. Also, it is desirable to transfer the wafers from the quartz boat back to the plastic carrier.

Typically, the silicon wafers in boats are quite close to each other. A typical quartz boat will hold fifty wafers. The quartz boats hold the wafers primarily for heating purposes in ovens, and accordingly there does not need to be much space between the wafers. The spacing in plastic carriers is about half the density, or about twice as great as the spacing of the wafers in the quartz boats. There are normally about twenty-five wafers per plastic boat. The reason for the difference in spacing is that the wafers in the plastic boats will be subject to acid baths or other chemical processing, etc., and thus greater spacing is required between wafers.

The wafers can, of course, be manually transferred, but this is a delicate, tedious process, perhaps requiring the use of a tweezers, with the result that the delicate wafers are often damaged or contaminated through handling. If the damage is immediately detected, this is a serious loss simply because of the cost of the partially processed wafers. If the damage or contamination is not detected until later, in the form of an unacceptable end product or system in which the product is used, the loss is greatly amplified.

In the prior art are also disclosed wafer transfer apparatus which transfer wafers from a first carrier to a second carrier. For example, EP-A-0147435, discloses a wafer transfer apparatus comprising a table with two stations and with a single lifting means which transports the wafers from one station to another and deposits said wafers in the appropriate carrier. This single lifting means is cumbersome and is in use throughout the full transfer process.

The automated system lifts a set of semiconductor wafers from a slotted carrier, transfer them laterally and lowers them into a second slotted carrier. In doing this, jaws on the lifting apparatus open automatically to receive or release the wafers. With a carrier having relatively high slotted sides, such as the commonly used plastic carrier, a pusher engages the lower edge of the wafers exposed through the bottom of the carrier and pushes them upwardly sufficiently far to permit the lifter jaws to receive and lift the wafers. The apparatus is oriented at a slight angle to insure that the wafers are all arranged in precise, spaced, parallel relation so as to cooperate with slots in the lifter jaws and slots in the receiving carrier. The system has the capability to move two sets of 25 wafers to a quartz boat having 50 more-closely spaced slots, and similarly, two sets from a quartz boat may be transferred to two different plastic carriers.

A similar principle is disclosed in U.S. Pat. No. 4,573,851.

EP-A-0163413 discloses an apparatus which transfers semiconductor wafers from and to carriers, in which the wafers are processed. The transfer apparatus includes a movable head having rotatable holder elements which hold the wafers. Wafers are moved out of and into the carriers by vertically moving lifting elements. The lifting elements move the wafers from a carrier to the rotatable holder elements, and vertical lifting elements move the wafer from the rotatable holder elements into carriers after the head has moved itself from one station to another. Typically, there are three positions and stations for the head, and vertical lifting elements are positioned at each station for moving wafers vertically to and from the carriers which are located at each station.

All these known transfer apparatus do not allow to change the sequence of loading and unloading which is necessary for many purposes in an automated wafer production. Accordingly, there is a need to remedy these drawbacks and to provide an improved transfer apparatus.

SUMMARY OF THE INVENTION

The invention as claimed therefore provides an apparatus for transferring wafers of at least one carrier into at least one second carrier. The carriers can be for example a quartz carrier having fifty slots or a plastic carrier only having twenty-five slots. The apparatus further comprises at least one loading station and at least one unloading station at which the carriers are positioned for raising the wafers to be transferred by lifting means. For moving the wafers from one station to another movable support means are provided to which wafer handling means are secured. The wafer handling means comprises two substantially cylindrical arms protruding from the support means and comprising a shaft and, at the free end, roller means with slots for holding and guiding wafers. The arms being rotatable along the long axis and being able to take four different positions: For passing the wafers and passing a second set of wafers between the arms and the first set of wafers (b), holding the first and the second set of wafers (c), and holding the second set of wafers and passing the first set of wafers between the arm and the second set of wafers (d). With this apparatus it is therefore possible to unload a first carrier which wafers occupy alternatively the odd or even numbers of slots depending on whether the arms are rotated into the one or into the opposite direction. Correspondingly, the wafers of a second carrier can pass between the wafers of the first carrier and occupy the free odd or eve slots, respectively. When unloading a fifty wafers carrier it also can be varied between loading at first the odd or the second number of wafers. This capability is very necessary for the automated wafer production in which this apparatus is integrated into a production line in order to provide flexibility in handling different wafer sets. For example, several sets of wafers can be mixed with other sets or any set of wafers can be taken of the process for testing or examining purposes.

In a preferred embodiment the rotation from one position to the next position is 90 degree. This facilitates the construction of the roller means and the control of the arms.

In a further preferred embodiment of this invention the roller means have a flat surface in the first position (a) and circular circumference with slots in the other positions (b), (c), (d). The slots have the same depth in the third position, the depth of the slots in the second and fourth positions are alternately larger or smaller, and the slots in the second position are shifted with respect to the fourth position. Preferably said smaller depth second and fourth position slots having a depth equal to that of said third position slots. This configuration allows a simple and precise manufacture of the roller means.

In another embodiment the outer circular circumference of the roller means is equal to the circumference of the shaft of the arm and made of plastic material and removable from the arm.

To prevent movement of the wafers during the handling of the transfer apparatus at least the arms and the lifting means are inclined in the range of 5 to 10 degrees so that the wafers to be transferred lean against the rear sidewall of the respective slots. Preferably the inclination is 7 degrees. In this embodiment the free end of the arms is higher than the fixpoint at the support means to provide a precise spaced parallel orientation.

BRIEF DESCRIPTION OF THE DRAWINGS

For a better understanding of the present invention, together with further objects and advantages, in the following description reference will be made to the accompanying drawings, in which.

DESCRIPTION OF THE PREFERRED EMBODIMENT

Figure 1:
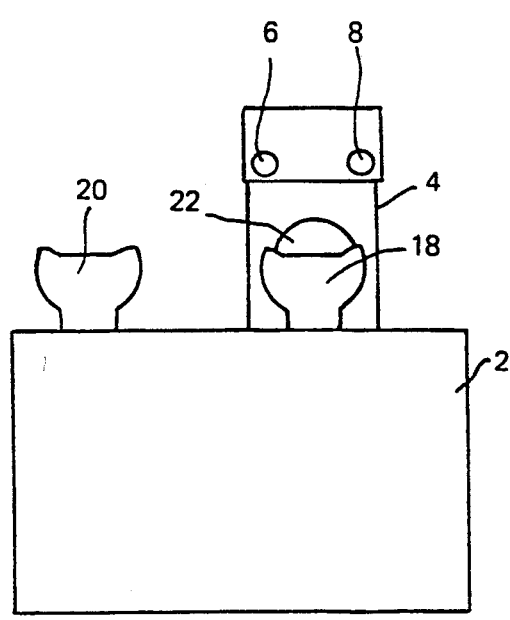
FIG. 1 is a front view of the wafer transfer apparatus with a filled carrier at a first station.
Figure 2:
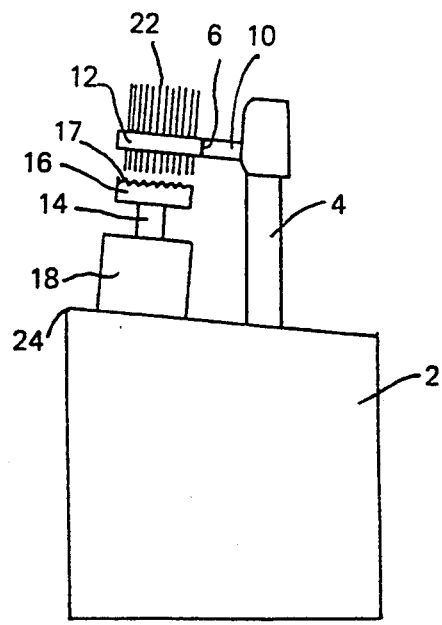
FIG. 2 is a side view of the wafer transfer apparatus with wafers hanging in the arms.

FIGS. 1 and 2 depict front and side views of the wafer transfer apparatus 2 according to the invention. The apparatus 2 comprises two arms 6, 8 fixed to support means 4. Each arm comprises a shaft 10 having roller means 12 at its free end. A first carrier 18, at a first station, is shown as filled with wafers 22 which have to be transferred by the arms 6, 8 into a second carrier 20 at a second station.

The wafers 22 are raised by lifting means comprising a pusher rod 14 and a pusher element 16 provided with slots 17 for receiving the wafers. The construction of such a pusher element is known from the above cited prior art documents EP-A-0163413 and EP-A-0147435. Once the pusher rod 14 and pusher element 16 has raised the set of wafers 24 out of the carrier 18 they engage and are held by the roller means 12 at the free end of the arms 6 and 8. The arms 6, 8, the table 24 on which the carriers can be placed, and the lifting means are inclined to make sure that the wafers are always held in a spaced parallel orientation in the carriers. The inclination in the preferred embodiment is 7 degrees.

In order to double the density of wafers to be transferred, a second set of wafers from a second carrier must be raised into the roller means 12 by the lifting means in the same manner. This can be accomplished as disclosed in the prior art by moving the support means 4 to a second station with second lifting means or by leaving the support means 4 in position and replacing the now employed first carrier 18 with a new filled carrier.

Since the wafers from the second carrier are inserted in the roller 12 between the wafers of the first set in order to reduce the space between the wafers, it is necessary to shift the second carrier in respect to the first carrier. By using a second station with second lifting means the pusher element which needs a second set of slots shifted in respect to the first set or the pusher element has to be shifted. By using only one station at which the wafers of both carriers are raised to build a new set of wafers having a smaller distance than in the first and second carrier, the pusher element needs a second set of slots shifted in respect to the first set of slots so that the wafers of both carriers are arranged alternately. Altering the position of the support means without altering the pusher element or carrier position is still another option.

Figure 3:
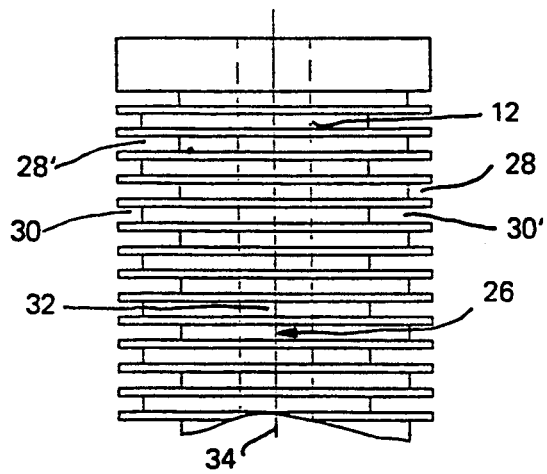
FIG. 3 is a top view of the roller means.
Figure 4:
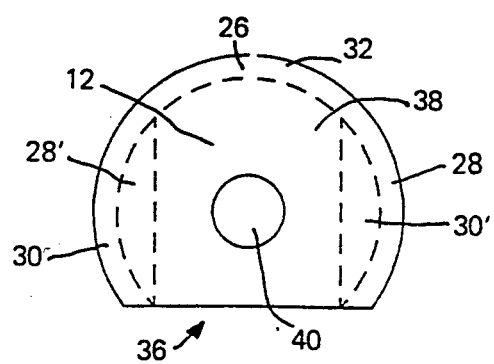
FIG. 4 is a front view of the roller.

FIGS. 3 and 4 show the roller means 12 in detail. FIG. 3 shows roller 12 with a number of slots arranged in sets 28 and 30. With the odd number slots 28 the wafers of one carrier are held by the roller means while the wafers of the other carrier can pass through the slots 30', and with the even number slots 30 the wafers of one carrier are held by the roller means while the wafers of the other carrier can pass through the slots 28'. With the middle 32 of the slots 28, 28' and 30, 30' in the region of the center line 34 the wafers of both carriers can be held by the roller means.

As shown in FIG. 4 the roller has a flat surface 36 which is used when the arms are in the first position. In this position the first set of wafers, independent whether the wafers are later held with the odd number slots 28 or the even number slots 30, pass between the flat surfaces of the roller means at both arms. The depth of the slots 28' or 30' are used for passing wafers between the arms. When the wafers have passed the flat surface up to a predetermined position, the arms rotate 90 degrees either both in the same direction or in different directions, depending on whether the construction of the roller means is identical or mirrored, to reach a second or a fourth position. In case that the arms are rotated 90 degrees into the second position, wafers only can be held by the odd number slots 28 and in case that the arms are rotated 90 degrees into the opposite direction, only even number slots 30 are able to hold the wafers of the first carrier. It is clear that dependent on the alignment of the first carrier in respect to the roller means, the arms had to be rotated either into the first or second direction to reach the second or fourth position. Coming from the second or fourth position the arms rotate 90 degrees into a third position after the wafers of the second carrier have passed between the roller means through the slots 28' or 30', respectively. In the third position both sets of wafers are held by the roller means.

The roller means of this embodiment are made of plastic material and can for example easily be manufactured of a piece solid material having a cylindrical shape. the roller means have a core 38 with an inner bore 40 for receiving the free end of the arm with an adapted diameter to be fixed at the arm. The outer circumference can correspond with the circumference of the shaft 10 of arm. The roller can be removable from the arm.

Transferring wafers from two twenty-five slots carriers to one fifty slots carriers is accomplished by raising the set of wafers of a first carrier by the lifting means. The wafers pass between the arms which are in the first position up to a predetermined position a little above the arms in order to allow a proper rotation, subsequently the arms rotate 90 degree into the second or fourth position, depending on which of the set of slots 28 or 30 shall be occupied, and the lifting means are lowered to place the wafers into the respective slots. Then, a second carrier is placed on the table and aligned to the respective slots in the roller means, and the lifting means raise this set of wafers to pass between the arms through the respective slots 28' or 30' to the predetermined position. After the rotation of the arms into the fourth position the lifting means arc lowered so that now these wafers are held by the roller means in the slots 32.

With all the wafers hanging between the arms, the support means 4 move to a second station at which the wafers are inserted into a carrier having fifty slots. Principally it is also possible, to use the first station for the fifty slots carrier, but in view of a complete automated transfer process with the use of roboters this is not so economical. The wafers are raised by the same or other lifting means up to the predetermined position which allows the rotation of the arms again into the first position so that the fifty wafers can be lowered by the lifting means into the carrier placed at the second station.

The transfer from a fifty slot carrier into two twenty-five slot carrier is accomplished vice versa. With the roller means and the rotation in 90 degree steps according to the invention, the transfer apparatus can be very flexible used in the automated wafer production because of the change of the lifting sequence. Thus, the wafer can be differently mixed or inserted into or removed from the process for testing purposes of detecting process faults.

What is claimed is:

1. Apparatus for transferring wafers of at least one carrier into at least one second carrier, comprising;
   a loading station,
   an unloading station;
   lifting means for raising the wafers to be transferred;
   support means movable between said stations; and
   a wafer handling assembly secured to the support means and being able to take several positions for handling said wafers;
   said wafer handling assembly comprising a pair of rotatable parallel shafts maintained a fixed distance apart, each shaft being rotatable through 360° and having at its free end, rollers with slots for holding and guiding wafers, said shafts being able to take four different positions, each of said positions being 90° from any adjacent ones of said other positions wherein,
   in said first position said lifting means can pass a first set of wafers between said rollers,
   in said second position while holding the first set of wafers, a second set of wafers may be lifted between said rollers and interdigitated with said first set of wafers,
   in said third position said first and said second set of wafers may be held, and
   in said fourth position and said first and said second set of wafers may be released from said rollers.

2. Apparatus according to claim 1, wherein each of said rollers has a flat surface extending its entire length in said first position and reduced circular circumferences in said slots, each slots further having a flat surface therein perpendicular to the flat surface extending the entire length of the roller, the flat surfaces in each slot being alternately offset 180 degrees from the next adjacent slot.

3. Apparatus according to claim 2, wherein said roller means is formed of plastic and removable from said arms.

4. Apparatus according to claim 1, wherein said shafts and said lifting means are inclined between 5 and 10 degrees to the vertical so that the wafers to be transferred lean against the rear sidewall of the respective slots.

5. Apparatus according to claim 4, wherein said inclination is 7 degrees.

* * * * *